(12) United States Patent
Huang et al.

(10) Patent No.: US 11,782,083 B2
(45) Date of Patent: Oct. 10, 2023

(54) RELAY POGO CHARGED DEVICE MODEL TESTER USING ELECTROSTATIC DISCHARGE METHOD AND STRUCTURE FOR REPEATABLE CHARGED DEVICE MODEL TESTING

(71) Applicant: ESDEMC Technology LLC, Rolla, MO (US)

(72) Inventors: Wei Huang, Rolla, MO (US); David Pommerenke, Graz (AT); Huiping Yang, Guangzhou (CN); Matthew Drallmeier, Rolla, MO (US)

( * ) Notice: Subject to any disclaimer, the term of this patent is extended or adjusted under 35 U.S.C. 154(b) by 0 days.

(21) Appl. No.: 17/727,415

(22) Filed: Apr. 22, 2022

(65) Prior Publication Data

US 2022/0341981 A1    Oct. 27, 2022

Related U.S. Application Data

(60) Provisional application No. 63/178,419, filed on Apr. 22, 2021.

(51) Int. Cl.
| | |
|---|---|
| *G01R 31/00* | (2006.01) |
| *G01R 1/073* | (2006.01) |
| *G01R 3/00* | (2006.01) |
| *G01R 31/28* | (2006.01) |

(52) U.S. Cl.
CPC ....... *G01R 31/002* (2013.01); *G01R 1/07342* (2013.01); *G01R 3/00* (2013.01); *G01R 31/2889* (2013.01); *G01R 1/07314* (2013.01); *G01R 1/07378* (2013.01); *G01R 31/2886* (2013.01)

(58) Field of Classification Search
CPC .... G01R 31/002; G01R 1/07342; G01R 3/00; G01R 31/2889; G01R 1/07378; G01R 31/2886; G01R 1/07314
USPC ......... 324/71, 378, 403, 415, 425, 500, 537, 324/756.01, 756.03
See application file for complete search history.

(56) References Cited

U.S. PATENT DOCUMENTS

| | | | | |
|---|---|---|---|---|
| 2015/0096875 | A1* | 4/2015 | Ruggiero | H02G 3/086 200/297 |
| 2016/0241114 | A1* | 8/2016 | Cullen | H02K 11/28 |
| 2020/0185893 | A1* | 6/2020 | Yamazaki | H02B 3/00 |
| 2022/0344913 | A1* | 10/2022 | Bhatt | H02B 1/36 |

* cited by examiner

*Primary Examiner* — Raul J Rios Russo
(74) *Attorney, Agent, or Firm* — Charles McCloskey

(57) ABSTRACT

A relay pogo contact first charged device model test head apparatus for relay-based contact first field induced charged device model testing has a ground plane of conductive material, a coaxial connector whose outer conductor electrically connects to the ground plane, a current-sensing element with one terminal electrically connects to the ground plane and the other terminal electrically connects to the center conductor of the coaxial connector, a switch where the first terminal electrically connects to a center conductor of the coaxial connector, and a probe with one end electrically connected to a second terminal of the switch and the other end exposed to contact external objects.

20 Claims, 7 Drawing Sheets

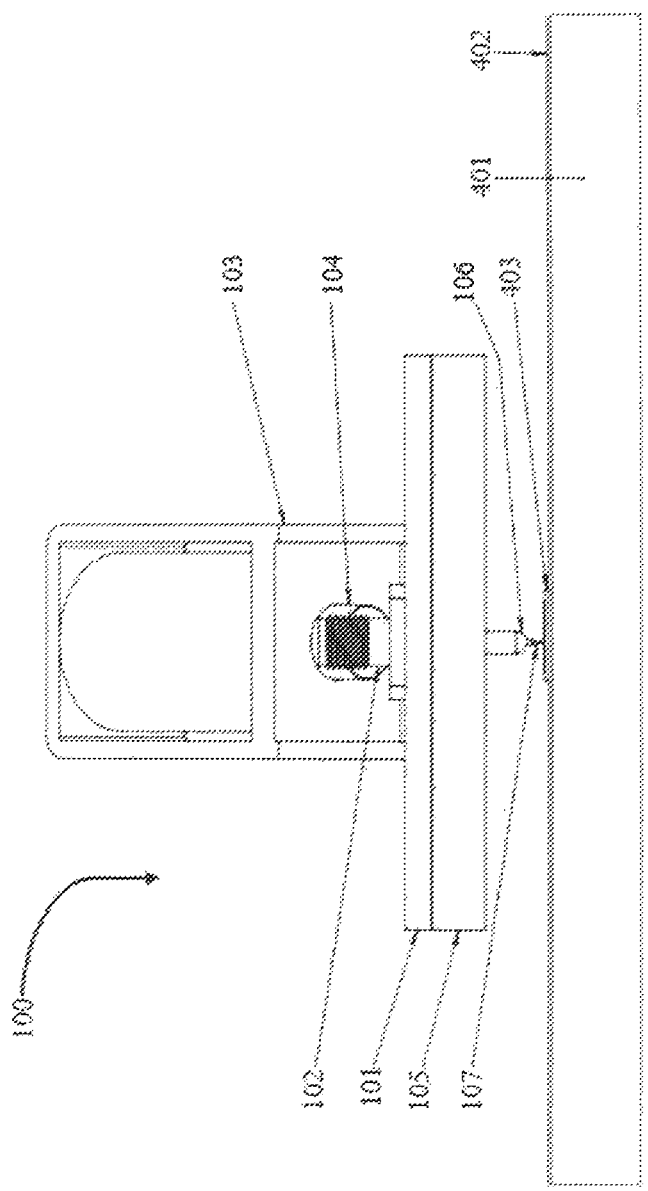

RELAY POGO CHARGED DEVICE MODEL TESTER USING ELECTROSTATIC DISCHARGE METHOD AND STRUCTURE FOR REPEATABLE CHARGED DEVICE MODEL TESTING

CROSS REFERENCE TO RELATED APPLICATION

The present application claims priority to U.S. provisional patent application Ser. No. 63/178,419 filed on Apr. 22, 2021 by the same inventors.

FIELD OF THE INVENTION

The present invention relates to an apparatus for Charged Device Model (CDM) testing. More specifically, the present invention relates to a CDM tester utilizing a relay to control electric field induced ElectroStatic Discharge (ESD) to occur after the CDM tester has established electrical connections with selected pins of the Device Under Test (DUT).

DESCRIPTION OF RELATED ART

A Charged Device Model (CDM) event occurs when the pin of a charged electronic device approaches an external metal object such that the voltage potential difference exceeds the breakdown voltage of the air gap between them. The device generally becomes charged by either electric field charging, in which electric fields near the device cause the voltage potential of the device to change without changing its net charge, or tribo-charging, in which a static charge is generated when the device slides on another surface. Field induced CDM (FICDM) testing is an existing method to simulate a true CDM event. In this method, the electronic DUT is placed on a metal plate with the test head apparatus positioned above the device such that a telescopically compressible probe (known as a "pogo pin") is located directly above a selected pin of the DUT. The metal plate, referred to as a charge plane, is given a high voltage potential which in combination with the ground plane of the test head apparatus creates a strong electric field under which the device becomes capacitively charged, i.e., becoming charged due to an electric field between two conductors. The test head then descends toward the selected pin of the DUT until the pogo pin contacts the selected pin of the DUT. The desired ESD event happens at some point before the pogo pin makes physical contact with the selected pin when the tip of the pogo pin is close enough to the selected pin for the field induced charge to arc from the device to the pogo pin. The distance at which the event occurs is referred to as the spark gap. This breakdown in voltage is measured by an oscilloscope connected to the test head apparatus via a coaxial cable which is connected to the coaxial connector of the current sensing element of test head apparatus.

The current FICDM testers suffer from repeatability issues due to the variable spark resistance of the air discharge making the practice difficult to standardize. As CDM testing voltages decrease, the variability of the air discharge increases which causes concern over the ability to meaningfully classify devices at lower voltages.

To mitigate this growing concern, a new contact-first method (CCDM) has been developed and is currently being further refined. Current designs place a switch to control the connection of the pogo pin to either the high voltage source or the oscilloscope. This method removes the field charging aspect of the test since the high voltage pulse travels through the coaxial cable, is reflected by the device, and is then measured by the scope. This method eliminates the variability of the spark resistance but introduces the need to replace this omitted resistance to obtain the same measured waveforms as in FICDM testing, however the value of the resistance is a topic of ongoing research and is yet to be determined. Due to this difference in impedances, CCDM waveforms are significantly smaller than FICDM current measurements for a given voltage level, leading to differing criteria for the result of the test in its intent to classify devices' resilience to CDM events at a given voltage level.

Although the waveforms captured using each method are similar, they are fundamentally different due to the mechanisms which cause the ESD event in each case. The FICDM method is theorized to be the simulation method most accurate to a real world ESD event, but this method poses significant repeatability errors at lower stress levels. The CCDM method was proposed as an alternative, but this method introduces conditions not accurate to a theorized real world CDM event. The CCDM method is a less than ideal, direct solution to the repeatability problem of FICDM testing at lower stress voltages.

SUMMARY OF THE INVENTION

In the preferred embodiment of the invention, a relay-pogo charged device model, hereinafter "RP-CCDM" test head apparatus for contact first field induced CDM testing is provided. The present invention utilizes a wetted reed switch relay located directly between the pogo pin and the current sensing element of the CDM test head apparatus. The wetted relay internal contacts ensure an exceptionally consistent contact surface with minimal bouncing of physical contacts due to the impact of connection; this allows for a highly consistent and repeatable connection. The current sensing element is housed within the ground plane. The inner contact of the current sensing element is connected to the upper terminal of the reed switch and the center conductor of the coaxial connector. The outer contact of the disk resistor is terminated to the ground plane which is also electrically connected to the outer conductor of the coaxial connector.

The geometry of the test head, specifically the length of the path from the pogo pin tip to the current sensing element, is changed with the addition of the reed switch. To reduce the effect of altering the physical geometry of the test head apparatus, the ground plane of the test head apparatus is constructed from multiple conductive ground planes which contact one another. The lower most ground plane has contours to recess the upper terminal of the reed switch past the nominal height of the ground plane with respect to the tip of the pogo pin.

The test head apparatus allows for the ability to perform relay-based contact-first CDM testing under a strong electric field by lowering the test head apparatus to make electrical connection with a selected pin of the DUT while keeping the relay open. The charge plane is then connected to the voltage source at the desired testing level. The connection of the relay is closed to cause an ESD event. This event is measured by the current sensing element which is housed in the ground plane and connected to the oscilloscope via a coaxial connector and cable. This method will be referred to as a RP-CCDM test.

The test head apparatus also maintains the ability to perform the traditional air discharge under field charging as specified for FICDM. This is accomplished by closing the reed switch and using the test head in the same way that a traditional FICDM test is performed as described. This method will be referred to as an ACRP-CCDM test.

The invention has a ground plane of conductive material, a coaxial connector whose outer conductor has electrical connection to the ground plane, a current-sensing element where one terminal has electrically connection to the ground plane and the other terminal has electrical connection to the center conductor of the coaxial connector, a switch where the first terminal has electrical connection to the center conductor of the coaxial connector, and the second terminal has electrical connection to a probe where one end has electrical connection to the second terminal of the switch and the other end remains exposed such that it may contact external objects.

Also, in an alternate embodiment, the ground plane has multiple conductive ground planes in contact with one another. Also, in an embodiment, the ground plane contains an aperture for housing the current-sensing resistor and may contain additional apertures for mounting and aiding in general usability. Also, in an embodiment, the ground plane may contain specific contours, such as conical and concave, to achieve a desired electrical property. Also, in an embodiment, the coaxial connector may include an SMA connector or other such that it possesses the appropriate electrical specifications for the desired measurements and can be mechanically housed on or in the ground plane. Also, in an embodiment, the current-sensing element may include a disk resistor, resistor array, or other such that it possesses the appropriate electrical specifications for the desired measurements and can be mechanically housed in or on the ground plane. Also, in an embodiment, the switch may have a reed switch or other such that it provides a fast and stable enough switch for the desired measurements. Also, in an embodiment, a solenoid and ferrous rod or other hardware may mount upon the RP-CCDM test head apparatus as a means for opening and closing the switch. Also, in an embodiment, the probe has length enough so that it may contact external objects without disturbing the desired performance of the RP-CCDM test head apparatus. Also, in an embodiment, the probe has a small enough width such that it may precisely contact external objects, and large enough width so that its electrical properties do not disturb the desired performance of the RP-CCDM test head apparatus. Also, in an embodiment, the probe may have a pogo-pin or other type such that it reliably contacts the target device.

In another aspect of the invention, a method of field-induced contact-first charged device model, or CDM testing has the steps:
(a) positioning the RP-CCDM test head apparatus above a DUT's target location when the test head's switch is in the open position and a conductive field plate below the DUT and a dielectric plate is electrically connected to a ground reference of little to no charge,
(b) lowering the test head such that the probe touches the DUT's target location,
(c) switching the conductive field plate's electrical connection to high voltage and waiting for the DUT to charge,
(d) closing the switch to cause an electrical discharge, and
(e) measuring the electrical current through the DUT.

In one embodiment of the method, an insulating dielectric plate rests upon the top of the field plate and the DUT then rests upon top of the insulating plate during testing. Also, in one embodiment, for more measurements after the initial measurement, the conductive field plate has electrical connection to the ground reference, the switch is opened, the test head raises breaking contact with the DUT, and the steps described above are repeated. Also, in one embodiment, converting the voltage measurement of the current-sensing element into electrical current measures the electrical current through the DUT.

BRIEF DESCRIPTION OF THE DRAWINGS

In referring to the drawings,
FIG. 4 is a front view of the RP-CCDM head of FIG. 1 shown probing an electronic device.

DETAILED DESCRIPTION OF THE INVENTION

The present invention provides a charged device model, or CDM, tester that incorporates a relay or switch into the pogo pin structure and maintains adherence to the Joint CDM Standard ANSI/ESDA/JEDEC JS-002 for field induced CDM, or FICDM, testing. The use of a mercury wetted reed switch in the pogo pin allows for a more consistent spark resistance during low voltage pulses when compared to discharges in air. The method using the tester also preserves the field induced charging method and closely replicates the real world CDM charging mechanism.

Figure 1:
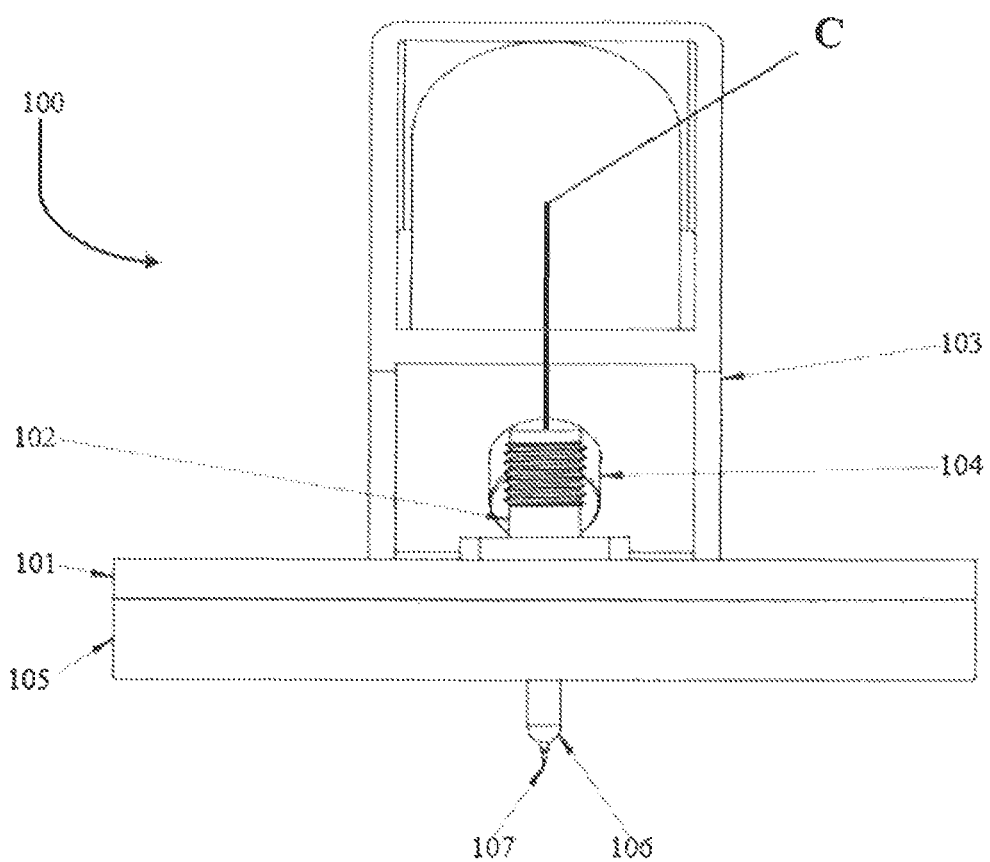
FIG. 1 is a front view of an RP-CCDM test head according to an embodiment of the present invention.

FIG. 1 is a front view of an RP-CCDM test head 100 according to an embodiment of the present invention. In this example, test head 100 consists of a flat conductive ground plane 101 connected on top of a larger ground plane 105, whose geometry causes the measured waveforms to adhere to the specifications described in ANSI/ESDA/JEDEC JS-002-2018. The geometry also appears in a section view of test head 100. Other geometries may also control the shape of the measured current waveform. The ground plane has a composition of conductive material.

Contact between test head 100 and a device under test, or DUT, should be made by landing a probe, or a pogo-pin 107, onto the DUT. A pogo-pin preferably has the ability to compress under mechanical stress, however, other probes or contacts also work. The tip size, of pogo-pin 107 has a small size relative to the DUT such that precise contact occurs between pogo-pin 107 and the DUT. The total length of pogo-pin 107 maintains the proper current waveform shape. The pogo-pin, or probe, has two ends. One end as at 107a makes an electrical connection while the other end 107b remains exposed, that is, not electrically connected. The other end 107b may contact external objects.

In this embodiment, pogo-pin 107 through its end 107a has an electrical connection to one electrical terminal of reed switch 106. The preferred method for this connection includes soldering these two components. This allows for proper electrical conductivity and mechanical stability, and it allows for ease of assembly. The other terminal of reed switch 106 has electrical connection to one terminal of a resistive current-sensing element, not shown, and to a center conductor 102a of a coaxial connector 102, preferably an SMA connector where SMA means Sub Miniature version A. The other terminal of the resistive current-sensing element previously mentioned has its connection to an outer conductor 102b of the coaxial connector 102 so a voltage measurement taken directly across the current sensing element. The electrical connections between the current-sensing element, reed switch 106, and coaxial connector 102 may alternatively have solder.

In this example, an SMA connector provides an acceptable measurement bandwidth for capturing a desired current waveform by measurement equipment.

Reed switch 106 then allows for a fast transition between open and closed states, under electrical control. The use of a conductive liquid, such as mercury, inside reed switch 106 reduces mechanical jitter when closing the switch. Reed switch 106 has control from applying electrical current to solenoid 103. The magnetic field generated by solenoid 103 orients at reed switch 106 by ferrous rod 104 to aid in the switching of reed switch 106 between closed and open states.

Figure 2:
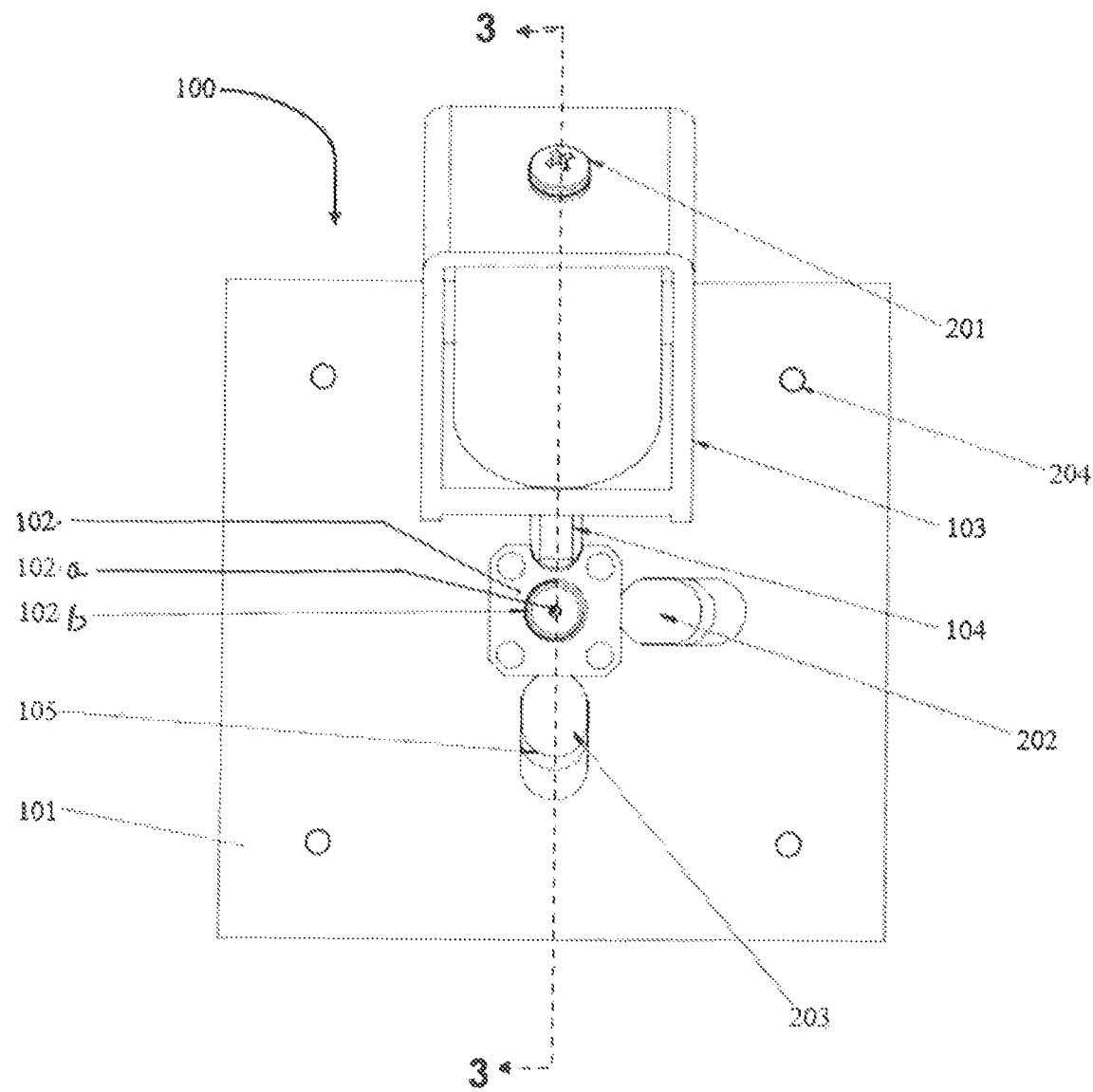
FIG. 2 is a top view of the RP-CCDM test head of FIG. 1.

FIG. 2 is a top view of the RP-CCDM test head 100 of FIG. 1. Many of the elements of FIG. 1 remain visible from this top view including around plane 101, SMA connector 102, solenoid 103, ferrous rod 104, and ground plane 105. Additionally, M3 pan head screw 201 appears and serves as a means for attaching ferrous rod 104 to solenoid 103 in this embodiment. Other means for making this connection may see usage and other methods for directing magnetic field to a reed switch see usage so long as they do not interfere with the invention.

Ground plane apertures 202 and 203 appear in ground planes 101 and 105 to allow for a view of the DUT and to ensure that test head 100 has proper relative position to the DUT. Size, shape, and number of ground plane apertures 202 and 201 may vary, but the size should allow a clear line of sight under test head 100 and but small enough to not affect the electrical properties of ground planes 101 and 105. A preferred embodiment of the invention will have two apertures to allow for cameras to provide two viewing angles of the DUT. Other means of viewing the DUT and ensuring the position of the test head should not interfere with the invention.

Mounting aperture 204 and the other three identical mounting apertures at each corner of ground planes 101 and 105 appear to allow for connecting ground planes 101 and 105. The use of two ground planes allows for greater ease of assembly. A different number of ground planes may be used and connected if the ground plane structure achieves the mechanical and electrical properties described.

Figure 3:
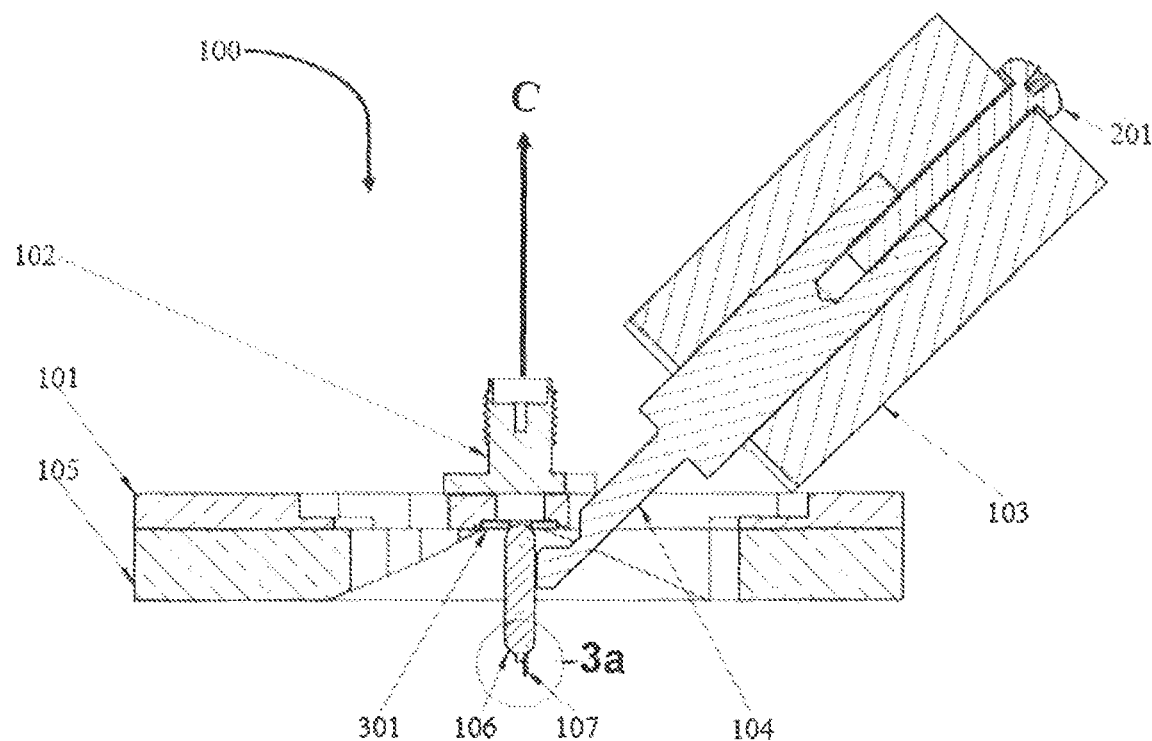
FIG. 3 is a section view of the RP-CCDM test head of FIG. 1.

FIG. 3 is a section view of the RP-CCDM test head 100 of FIG. 1 according to an embodiment of the present invention. Many of the elements of FIG. 1 again appear from this section view including ground plane 101, SMA connector 102, solenoid 103, ferrous rod 104, ground plane 105, reed switch 106, pogo-pin 107, and M3 pan head screw 201. Additionally, resistive current-sensing element 301 appears along with greater detail of some other items.

In this example, resistive current sensing element 301 has the form of a single disk resistor. The element 301 has superior low-parasitic performance at high electrical frequencies which promotes taking accurate measurements. Other options for resistive current sensing elements may exist but they must not compromise measurement accuracy. In this sectional view, resistive current-sensing element 301 has electrical connection at one terminal to the outer conductor of SMA connector 102 and at the other terminal connected to reed switch 106 and the center conductor of SMA connector 102.

This sectional view also illustrates the conical geometry of ground plane 105. The conical geometry surrounds reed switch 106 and pogo-pin 107 uniformly 360 degrees, which gives test head 100 the electrical characteristics to generate current waveforms as specified in ANSI/ESDA/JEDEC JS-002-2018.

Figure 3A:
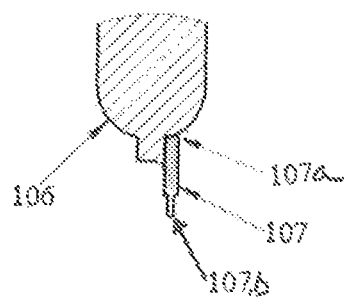
FIG. 3a is an enlargement of FIG. 3.

FIG. 3a provides an enlarged view of the connection between reed switch 106 and pogo-pin 107.

FIG. 4 is a front view of the RP-CCDM test head 100 of FIG. 1 shown probing an electronic device on top of a dielectric plate and conductive field plate. This view illustrates the preferred orientation of test head 100 relative to DUT 403, dielectric plate 402, and conductive field plate 401.

In this example, DUT 403 has the form of an unpowered ball grid array, or BGA, integrated circuit, though a very wide variety of devices may undergo testing. The DUT may include devices outside of electronics. The dielectric and field plate may vary in size, shape, and material, but should adhere to the requirements of ANSI/ESDA/JEDEC JS-002-2018.

Figure 5:
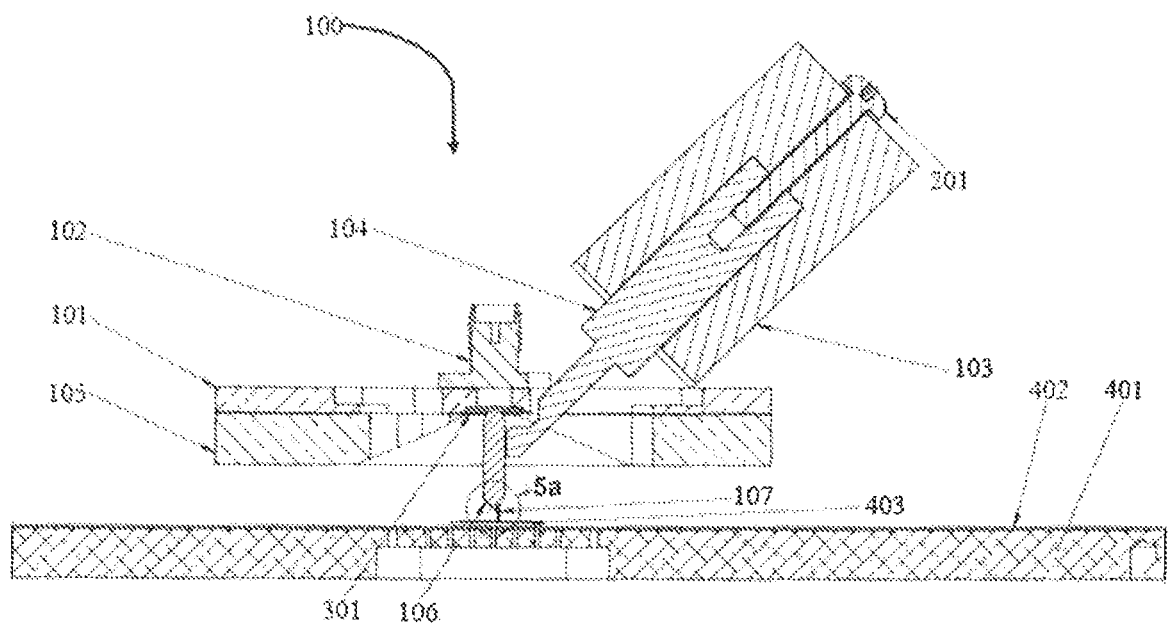
FIG. 5 is a section view of the RP-CCDM head of FIG. 1.

FIG. 5 is a section view of the RP-CCDM head 100 of FIG. 1 shown probing an electronic device on top of a dielectric plate and conductive field plate. Elements of the previous figures appear again can be seen in this view including ground plane 101, SMA connector 102, solenoid 103, ferrous rod 104, ground plane 105, reed switch 106, pogo-pin 107, M3 panhead screw 201, current sensing resistor 301, conductive field plate 401, dielectric plate 402, and DUT 403. This sectional view, which shows more elements of test head 100, further illustrates the preferred orientation of test head 100 relative to DUT 403, dielectric plate 402, and conductive field plate 401. A larger image of pogo-pin 107 contact with a pin of DUT 403 appears as in FIG. 5a and to increase understanding of this example of test head 100 probing a device.

Figure 5A:
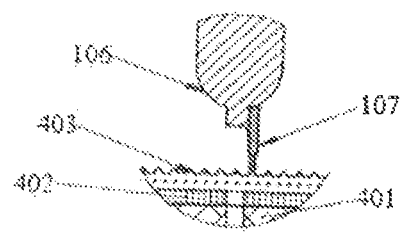
FIG. 5a is an enlargement of FIG. 5.

FIG. 5a provides an enlarged view of the connection between reed switch 106 and pogo-pin 107. It also provides an enlarged view of the contact between pogo-pin 107 and DUT 403. This enlarged view also shows the stacking of conductive field plate 401, dielectric plate 402, and DUT 403.

Figure 6:
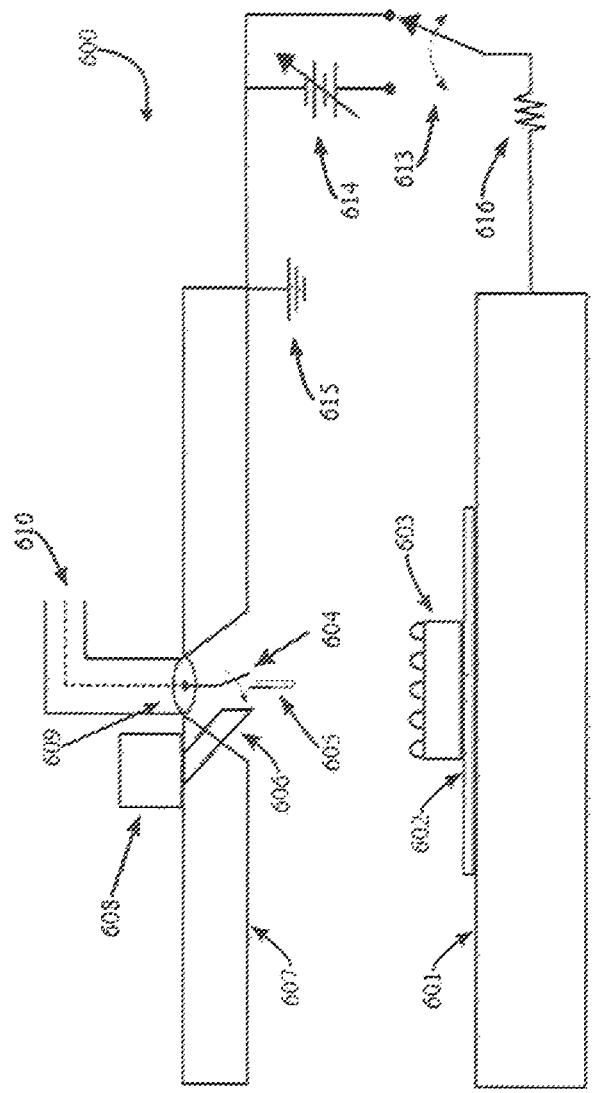
FIG. 6 is a side view of an RP-CCDM test head with ancillary electrical components.

FIG. 6 is an RP-CCDM test head section view and electrical diagram 600 of an RP-CCDM test application. In the typical application, conductive field plate 601 charges the capacitor formed by itself and DUT 603. DUT 603, an unpowered packaged integrated circuit, has its pins facing upwards on top of dielectric plate in accordance with the standardized testing procedures of ANSI/ESDA/JEDEC JS-002-2018.

In this testing setup, concave ground plane 607 forms a capacitor with conductive field plate 601 and DUT 603. Concave ground plane 607, electrically connected to ground reference 615 in the preferred setup, has its concavity such that the ESD pulses adhere to the waveforms described in ANSI/ESDA/JEDEC JS-002-2018. Before charging the device, the test head lowers on a robotic arm until pogo-pin 605 contacts a targeted pin on DUT 603. At this point, high voltage relay 613 switches to high voltage power supply 614 to charge DUT 603 through high voltage resistor 616. After charging the DUT 603, solenoid 608 activates and reed switch 604 closes. Ferrous rod 606 directs the magnetic field of the electromagnet such that the reed switch closes. The discharge initiated by reed switch 604 travels up pogo-pin 605 and reed switch 604 through current sensing resistor 609. Coaxial cable 610 then connects to electrical measurement equipment, typically an oscilloscope, which measures the voltage across the current sensing resistor and permits determining h the current.

Figure 7:
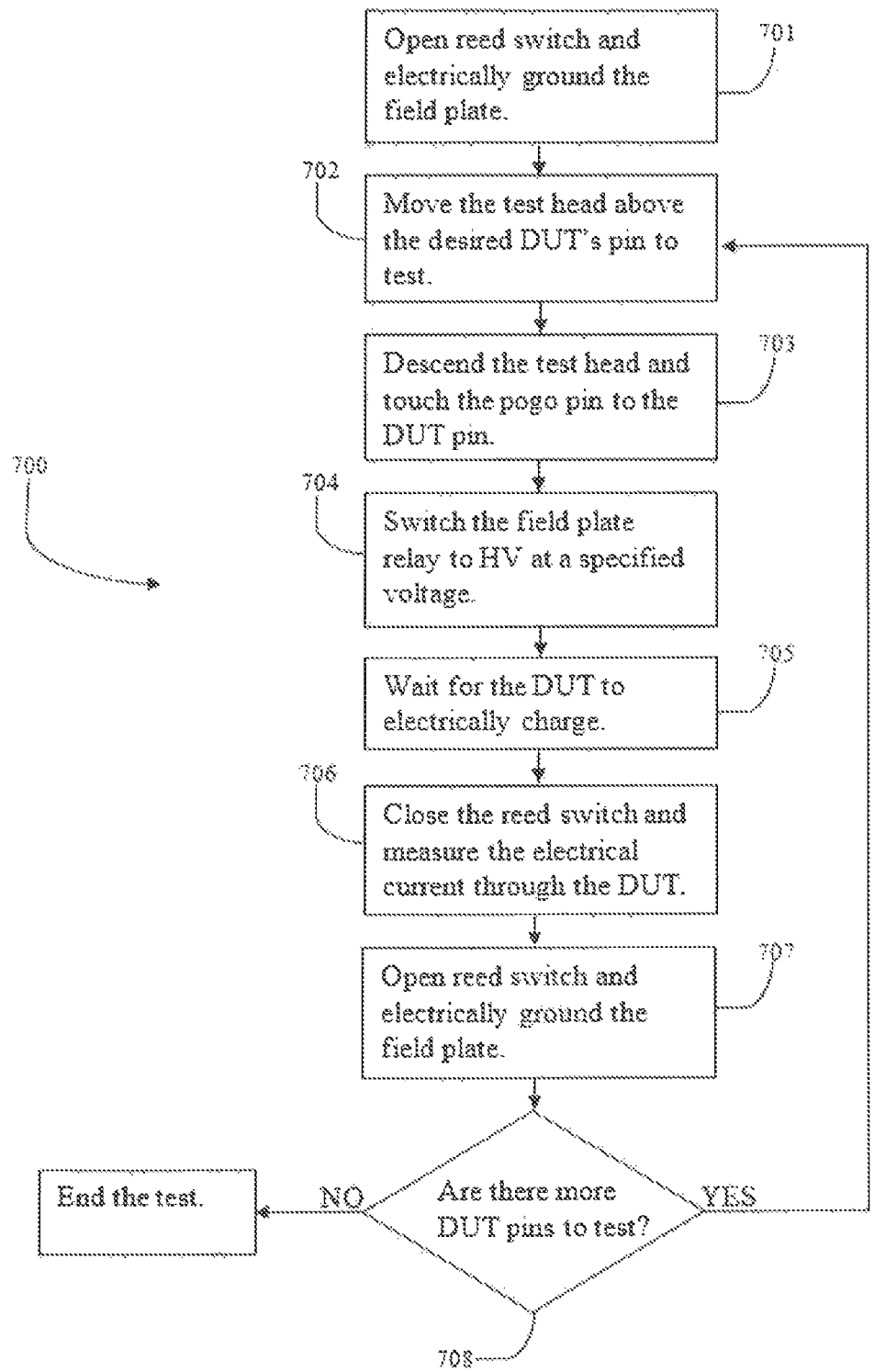
FIG. 7 is a flow chart for performing an RP-CCDM test.
The same reference numerals refer to the same parts throughout the various figures.

FIG. 7 is a flow chart 700 illustrating steps for performing an RP-CCDM test with the test head and electrical features previously shown in FIG. 6. At step 701, reed switch 604 opens so a very high-resistance path extends between pogo-pin 605 and current sensing resistor 609. Conductive field plate 601 has electrical connection to ground reference 615 through high voltage resistor 616 and high voltage relay 613 such that conductive field plate 601 has little to no charge.

At step 702, the RP-CCDM test head moves such that pogo-pin 605 aligns above the target pin on DUT 603. In this example, DUT 603 has the form of an unpowered packaged integrated circuit. Other DUT types may undergo testing by this invention. At step 703, the RP-CCDM test head lowers, lowering pogo-pin 605, to contact the target pin DUT 603. Again, the invention allows other DUT types and the target location to contact pogo-pin 605 may take other forms.

At step 704, conductive field plate 601 has electrical connection to high voltage power supply 614 through high voltage resistor 616 and high voltage relay 613 such that conductive field plate 601 now has a charge and charges DUT 603. The voltage setting of high voltage power supply 614 is arbitrary, but an operator may set specified test voltage levels of ANSI/ESDA/JEDEC JS-002-2018. At step 705, a typically short waiting period occurs for DUT 705 to charge. This waiting period usually depends on the size of the DUT.

At step 706, reed switch 604 closes forming a conductive path between pogo-pin 605 and current sensing resistor 609. This closure initiates a discharge of current that travels through pogo-pin 605, reed switch 604, and current sensing resistor 609. In this example, reed switch 604 closes by applying current to solenoid 608 and directing the magnetic field to reed switch 604 with ferrous rod 606. Other means of closing and opening a switch may see usage provided the desired electrical characteristics of the RP-CCDM test setup remain undisturbed. At this point, the discharge current of DUT 603 has its size determined by using measurement equipment, typically an oscilloscope, to measure the voltage across current sensing resistor 609. Electrical current is calculated based on the voltage measurement.

At step 707, reed switch 604 opens, and conductive field plate 601 has its electrical connection to ground reference 615 through high voltage resistor 616 and high voltage relay 613 such that conductive field plate 601 has little to no charge. At step 708, if there are more pins remaining on DUT 603 to test, the next step reverts back to step 702 and continues. If no more pins remain to test, the RP-CCDM testing ends.

The invention has a test head apparatus for relay-based contact first field induced charged device model testing that has these components: 1) a ground plane of conductive material, 2) a coaxial connector having a center conductor and an outer conductor where the outer conductor electrically connects to the ground plane, 3) a current-sensing element with two terminals, one terminal electrically connecting to the ground plane and the other terminal electrically connecting to the center conductor of the coaxial connector, 4) a switch having two terminals, a first terminal electrically connects to the center conductor of the coaxial connector, and 5) a probe having two ends, one end electrically connects to the second terminal of the switch and the other end remains exposed to contact external objects. The coaxial connector also has its electrical specifications for a certain measurement and this connector rests upon the ground plane. Then the current-sensing element takes the form of a disk resistor or a resistor array. The current sensing element also has its electrical specifications for a certain measurement. And the current sensing element rests in the ground plane.

Turning to the switch, the switch may take the form of a reed switch. The switch has its position between the probe and the current-sensing element. The switch may also have the structure of a solenoid and a ferrous rod extending from the solenoid. The solenoid and the ferrous rod cooperatively open and close the switch during usage.

The probe then has a length so it may contact external objects, and its width also to contact external objects. The probe may take the firm of a pogo-pin that may contact a target device, such as a DUT.

The ground plane then has its construction of a homogeneous material or a non-homogeneous material. The construction suits the DUT and other processes that utilize the invention. Alternately, the ground plane has multiple conductive ground planes in mutual contact. In the preferred and the alternate embodiments, the ground plane conducts electricity by conductive tape or conductive coating. Also, the ground plane has contours for promoting a certain electrical property during the testing processes of its usage. The ground plane also has a conical shape or a concave shape. In the various embodiments, the ground plane has an aperture for receiving the current-sensing element. In other embodiments, the ground plane has additional apertures outward from the aperture that receives the current-sensing element.

The invention also includes a method of field-induced contact-first charged device model testing of a device under test (DUT). The method has these steps:

1 connecting a probe to a first selected contact of a DUT with the DUT located on a conductive field plate,
2 providing a current-sensing element and a switch having a first terminal and a second terminal and the switch having an open position and a closed position, the probe being connected to the first terminal of the switch, the second terminal being connected to the current-sensing element, and the switch being in the open position,
3 applying a voltage from a voltage source to the conductive field plate, coupled to the DUT to charge the DUT;
4 operating the switch to the closed position after charging the DUT, wherein the switch discharges the DUT via the current sensing element; and
5 measuring an incident current via the current-sensing element.

During practicing of the method, the DUT is insulated from the conductive field plate via an insulating dielectric plate. This method of testing also includes additional steps of:

6 operating the switch to the open position;
7 changing the value of the applied voltage to further charge the device;
8 operating the switch to the closed position; and
9 measuring an incident current via the current sensing element.

Also, as this method occurs in usage, the value of the applied voltage changes by terminating the conductive field plate.

The invention also includes an alternate method of field-induced contact-first charged device model testing of a device under test (DUT). The method has these steps:

1 applying a voltage from a voltage source to a conductive field plate coupled to a DUT to charge the DUT;

2 connecting a probe to a first selected contact of a DUT after charging the DUT, providing a switch having a first terminal and a second terminal, the probe connecting to the first terminal of the switch, the second terminal connecting to a current-sensing element, and the switch being in the closed position; and 3 discharging the DUT through the switch via the current-sensing element.

As this method has its usage, the method has the DUT insulated from the conductive field plate via an insulating dielectric plate. This alternate method of testing also includes additional steps of:

4 operating the switch to the open position;

5 changing the value of the applied voltage to further charge the device;

6 operating the switch to the closed position;

7 measuring an incident current via the current-sensing element;

8 discharging the DUT through the switch and the current-sensing element; and 9 opening the switch and grounding the conductive field plate.

It will be apparent to one with skill in the art that the RP-CCDM and method of the invention may be provided using some or all of the mentioned features and components without departing from the spirit and scope of the present invention. It will also be apparent to the skilled artisan that the embodiments described above are specific examples of a single broader invention that may have greater scope than any of the singular descriptions taught. There may be many alterations made in the descriptions without departing from the spirit and scope of the present invention.

From the aforementioned description, an RP-CCDM has been described. The RP-CCDM is uniquely capable of performing relay contact first charged device model testing under field charging test conditions. The RP-CCDM and its various components may be manufactured from many materials, including but not limited to, vinyl, polymers, such as nylon, polypropylene, polyvinyl chloride, high density polyethylene, ferrous and non-ferrous metal foils, their alloys, and composites.

Various aspects of the illustrative embodiments have been described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations have been set forth in order to provide a thorough understanding of the illustrative embodiments. However, it will be apparent to one skilled in the art that the present invention may be practiced without the specific details. In other instances, well known features are omitted or simplified in order not to obscure the illustrative embodiments.

Various operations have been described as multiple discrete operations, in a manner that is most helpful in understanding the present invention, however, the order of description should not be construed as to imply that these operations are necessarily order dependent. In particular, these operations need not be performed in the order of presentation.

Moreover, in the specification and the following claims, the terms "first," "second," "third" and the like—when they appear—are used merely as labels and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skills in the art upon reviewing the above description. The Abstract is provided to allow the reader to ascertain the nature of the technical disclosure. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

As such, those skilled in the art will appreciate that the conception, upon which this disclosure is based, may readily be utilized as a basis for the designing of other structures, methods and systems for carrying out the several purposes of the present invention. Therefore, the claims include such equivalent constructions insofar as they do not depart from the spirit and the scope of the present invention.

We claim:

1. A test head apparatus for relay-based contact first field induced charged device model testing, comprising:
    a ground plane of conductive material;
    a coaxial connector having a center conductor and an outer conductor, said outer conductor connecting electrically to said ground plane;
    a current-sensing element having two terminals, wherein one terminal electrically connects to said ground plane and the other terminal electrically connects to said center conductor of said coaxial connector;
    a switch having a first terminal and a second terminal, wherein said first terminal electrically connects to said center conductor of said coaxial connector; and
    a probe having two ends, wherein one end electrically connects to said second terminal of said switch and the other end is adapted to remain exposed to contact external objects.

2. The test head apparatus of claim 1, wherein said coaxial connector has electrical specifications for a certain measurement and said connector rests upon said ground plane.

3. The test head apparatus of claim 1, wherein said current-sensing element is one of a disk resistor and a resistor array, said current sensing element has electrical specifications for a certain measurement, and said current sensing element rests in said ground plane.

4. The test head apparatus of claim 1, wherein said switch is a reed switch.

5. The test head apparatus of claim 1, wherein said switch has a position between said probe and said current-sensing element.

6. The test head apparatus of claim 1, further comprising:
    a solenoid and a ferrous rod extending from said solenoid, said solenoid and said ferrous rod cooperatively open and close said switch.

7. The test head apparatus of claim 1, wherein said probe has a length adapted to contact external objects, a width adapted to contact external objects, and said probe is a pogo-pin adapted for contact with a target device.

8. The test head apparatus of claim 1, wherein said ground plane has construction of either homogeneous material or non-homogeneous material.

9. The test head apparatus of claim 8, wherein said ground plane has multiple conductive ground planes in mutual contact.

10. The test head apparatus of claim 8, whereby said ground plane conducts electricity by one of conductive tape or conductive coating.

11. The test head apparatus as defined in claim 1, wherein the ground plane has contours for promoting a certain electrical property.

12. The test head apparatus of claim 1, wherein said ground plane is either a conical shape or a concave shape.

13. The test head apparatus of claim 1, wherein said ground plane has an aperture for receiving said current-sensing element, and additional apertures outward from said aperture receiving said current-sensing element.

14. A method of field-induced contact-first charged device model testing of a device under test (OUT), said method utilizing a conductive field plate, the OUT located on the conductive field plate, a current-sensing element, a switch having a first terminal and a second terminal, the switch having an open position and a closed position, a probe being connected to the first terminal of the switch, second terminal being connected to the current-sensing element, and the method comprising:
connecting the probe to a first selected contact of a OUT and placing the switch in the open position;
applying a voltage from a voltage source to the conductive field plate, the conductive field plate being coupled to the DUT thus charging the DUT;
operating the switch to the closed position after charging the DUT, wherein the switch discharges the DUT via the current sensing element; and
measuring an incident current via the current-sensing element.

15. The method as defined in claim 14, wherein the OUT is insulated from the conductive field plate via an insulating dielectric plate.

16. The method as defined in claim 14 further comprising:
operating the switch to the open position:
changing the value of the applied voltage to further charge the device;
operating the switch to the closed position; and
measuring an incident current via the current sensing element.

17. The method as defined in claim 16, wherein the value of the applied voltage changes by terminating the conductive field plate.

18. A method of field-induced charged device model testing of a device under test (DUT), the method utilizing a test head, a conductive field plate coupled, a probe, a switch having a first terminal and a second terminal, the probe connecting to the first terminal of the switch, the second terminal connecting to a current-sensing element, the method comprising:
opening the switch and grounding the conductive field plate;
moving the test head above a desired position over the OUT;
lowering the test head and contacting the probe to the OUT;
applying a voltage from a voltage source to the conductive field plate coupled to the OUT to charge the DUT;
pausing for the DUT to accumulate electrical charge;
connecting the probe to a selected contact of the DUT;
closing the switch;
measuring an incident current using the current-sensing element;
discharging the DUT through the switch and the current-sensing element; and
opening the switch and grounding the conductive field plate.

19. The method as defined in claim 18 further comprising:
said applying a voltage including adjusting the applied voltage during charging of the DUT.

20. The method as defined in claim 18, wherein said grounding the conductive field plate includes insulating the DUT from the conductive field plate utilizing an insulating dielectric plate and wherein said method is repeated for additional contacts of the DUT.

* * * * *